(12) United States Patent
Grimm et al.

(10) Patent No.: US 10,128,806 B2
(45) Date of Patent: Nov. 13, 2018

(54) METHOD OF CONTROLLING AN AUDIO AMPLIFIER UNIT AND AUDIO AMPLIFIER UNIT

(71) Applicant: Sennheiser electronic GmbH & Co. KG, Wedemark (DE)

(72) Inventors: Alexander Grimm, Wunstorf (DE); Axel Grell, Burgdorf (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 0 days.

(21) Appl. No.: 15/642,480

(22) Filed: Jul. 6, 2017

(65) Prior Publication Data

US 2018/0013394 A1    Jan. 11, 2018

(30) Foreign Application Priority Data

Jul. 7, 2016   (DE) .................. 10 2016 112 503

(51) Int. Cl.
*H03G 3/00*   (2006.01)
*H03G 3/30*   (2006.01)

(52) U.S. Cl.
CPC ................ *H03G 3/3005* (2013.01)

(58) Field of Classification Search
USPC ........ 381/107, 302, 71.4, 86, 365, 389, 104, 381/109, 28
See application file for complete search history.

(56) References Cited

U.S. PATENT DOCUMENTS

| 5,138,665 | A | * | 8/1992 | Ito | H03G 9/005 |
| | | | | | 381/101 |
| 2004/0101145 | A1 | * | 5/2004 | Falcon | H04S 7/00 |
| | | | | | 381/64 |
| 2007/0258609 | A1 | * | 11/2007 | Steinbuss | A61B 5/121 |
| | | | | | 381/312 |

* cited by examiner

*Primary Examiner* — Yosef K Laekemariam
(74) *Attorney, Agent, or Firm* — Haug Partners LLP

(57) ABSTRACT

A method for controlling an audio amplifier unit having an audio input, an amplifier, a volume regulation unit and an audio output. An audio signal is received via the audio input and is amplified by the amplifier, and an adjustment procedure modifies an operating curve of the volume regulation unit for the received audio signal. From a modified setting of the volume regulation unit, a modified amplification value is calculated according to a first volume operating curve. The amplifier's amplification is modified to match the modified amplification value, and a second volume operating curve is determined and assigned to the calculation of modified amplification values of the amplifier. The modified amplification value is substantially at the center of the second volume operating curve. Further, the volume regulation unit is adjusted mechanically or electrically to a predefined position.

22 Claims, 4 Drawing Sheets

METHOD OF CONTROLLING AN AUDIO AMPLIFIER UNIT AND AUDIO AMPLIFIER UNIT

The present application claims priority from German Patent Application No. 10 2016 112 503.2 on Jul. 7, 2016.

FIELD OF THE INVENTION

It is noted that citation or identification of any document in this application is not an admission that such document is available as prior art to the present invention.

The invention relates to an audio amplifier unit and a method for controlling an audio amplifier unit.

Audio amplifier units such as pre-amplifiers, audio-video (AV) receivers, full amplifiers or headphone amplifiers can be connected to different audio sources, such as e.g. a smart phone, a stationary CD player or the like.

However, these audio sources typically provide different input signal levels.

For compensating the different input signal levels of the audio sources connected to the audio amplifier unit, an external actuator can be used that lowers or raises the input signal level, such that the level range of the volume regulating button can be utilized better.

SUMMARY OF THE INVENTION

It is an object of the present invention to provide an audio amplifier unit and a method for controlling an audio amplifier unit, which allows an improved adaptation to the connected audio source. Further, the operating unit for volume control shall be improved.

Thus, a method for controlling an audio amplifier unit is provided. The audio amplifier unit has an audio input, an amplifier, a volume regulation unit and an audio output. An audio signal received via the audio input is amplified by the amplifier. By operating a control member, an adjustment process is started. A medium volume can be selected by operating the volume regulation unit. The volume regulation unit is adjusted mechanically and/or electrically such that a given volume setting is at a predefined position.

According to a further aspect of the present invention, the volume regulation unit has a control knob or slide control with a first position, a second position and a third position as well as an actuator for mechanical and/or electrical adjustment of the control knob or slide control, such that the first position is in a middle position (e.g. 12 o'clock position).

According to a further aspect of the present invention, the adjustment process can be performed for different audio sources connected to the audio input and/or for different output devices connected to the audio output, and the resulting settings can be stored.

The invention also relates to an audio amplifier unit with at least one audio input to which an external audio source can be connected. The audio amplifier unit further has an amplifier for amplifying an audio signal received via the audio input. Furthermore, the audio amplifier unit has a volume regulation unit for adjusting an amplification level of the amplifier. The audio amplifier unit has also an audio output to which an output device can be connected. The volume regulation unit is adapted for storing, for at least one connectable external audio source and/or at least one connectable audio output device, a setting at which a volume control knob of the volume regulation unit is in a 12 o'clock position which corresponds to a medium volume at the audio output or the audio output device.

An audio amplifier unit has typically at least one input for an external audio source, an amplifier stage for amplifying the received audio signals and a volume regulation unit for adjusting the volume.

The audio amplifier unit according to the invention enables a user-friendly adjustment of the listening volume.

With the audio amplifier unit according to the invention and the method for controlling an audio amplifier unit according to the invention, an audio amplifier unit is provided that enables a simple and effective adjustment of a volume control range to different input levels of the connected audio sources. Further, according to the invention a personal listening volume range preference can be considered. Thus, the listener becomes part of the regulation, so that an optimal adaptation to the listener's preference is possible.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
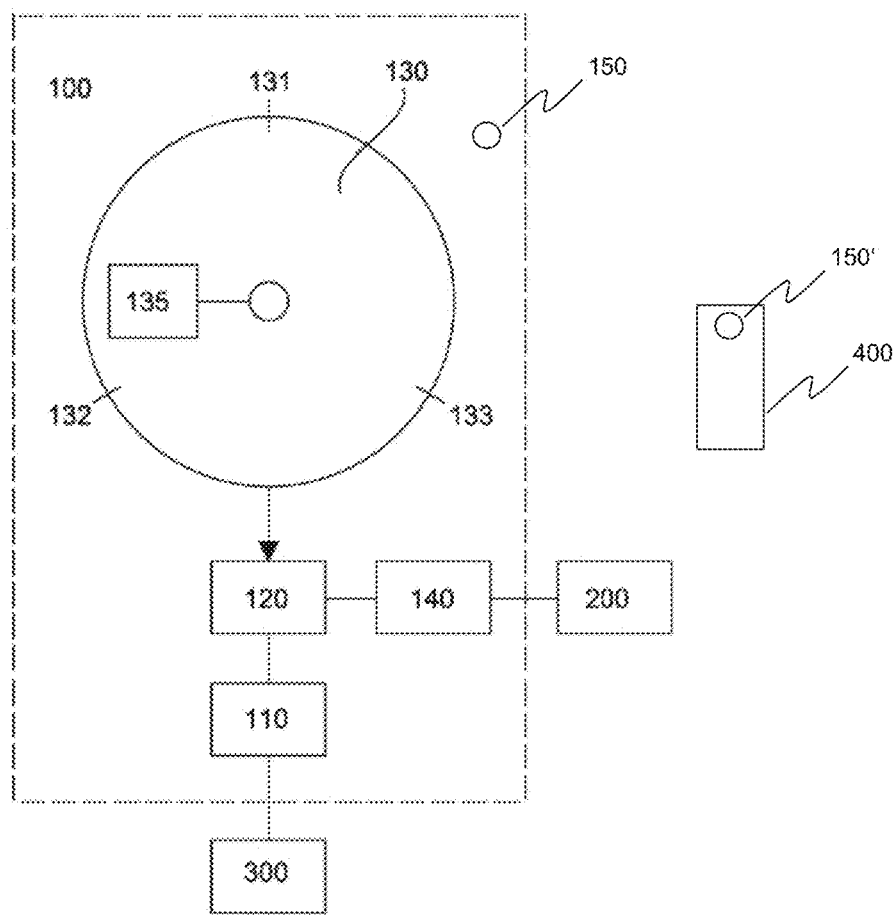
FIG. 1 shows a schematic block diagram of an audio amplifier unit according to the invention.

FIG. 1 shows a schematic block diagram of an audio amplifier unit according to the invention. In FIG. 1, an audio amplifier unit 100 with at least one audio input 110, an audio amplifier 120, a volume regulation unit 130 and an audio output 140 is provided. An external audio source 300 can be connected to the audio input 110. Optionally, an earpiece 200 can be connected to the audio output 140, e.g. headphones or earphones. Alternatively, loudspeakers or other audio output devices can be connected to the audio output 140.

The volume regulation unit 130 is for adjusting the amplification level of the amplifier 120. The volume regulation unit 130 can comprise e.g. a control knob. Optionally, the control knob can have a first position 132 (e.g. 7 o'clock position), a second substantially middle position 131 (e.g. 12 o'clock position) and a third position 133 (e.g. 5 o'clock position). The first position 132 can represent the minimum volume, the third position 133 can represent the maximum volume, and the second position 131 can represent a medium volume. Other positions than the 12 o'clock, 5 o'clock or 7 o'clock positions are also possible. E.g. the first position 132 can be near a 6 o'clock position and the second position 131 near a 3 o'clock position. The complete slewing range may also be more than 270° or less than 270°. The volume regulation unit 130 may comprise a control member 150 for adjustment, with which the control range of the volume regulation unit can be adjusted. The control member 150 may be implemented as a knob or a button. Alternatively, the volume control knob may also be a push button. Moreover, alternatively or additionally, a corresponding control member 150' may be provided on a remote control 400. In one embodiment, it can be automatically detected that the volume regulation unit 130, after being set to any particular position, remained for a given time in that position. Based on that, a re-adjustment or tracking may be performed automatically, wherein the current volume is selected automatically as the new medium volume and the volume regulation unit 130 is driven to the predefined position. Optionally, this automatic tracking may be switched on and off.

Before operating the control member 150, the user may connect an audio source 300 to the audio input 110 and, using the volume regulator, set the volume as desired or comfortable for the user. Depending on the connected audio source 300 and the audio output level provided by the audio source (e.g. smartphone 250 mV, stationary CD player 2V), the volume desired by or comfortable for the user will differ very much. For audio sources providing a high output level, the user will turn the volume control knob towards the 7 o'clock position 132, and for signal sources providing a low output level towards the 5 o'clock position 133. A medium volume as desired or pleasant for the user is thus assigned to a position of the volume control knob that, as a start, needs not necessarily be the middle or 12 o'clock position 131.

By operating the control member 150 the input adjustment function is launched, and the volume control knob is rotated by an actuator 135 such that the medium volume (setting) is in the 12 o'clock position 131. In the case of a slide control, the slide control is driven to a middle position. The actuator 135 may be e.g. a motor. This adjustment, or setting respectively, of the control member does not modify the current volume, but only modifies the relative position of the volume control knob and the knob's effect in usage, particularly the volume operating curve. For other kinds of volume regulators, e.g. a slide control, the adjustment works correspondingly. If the user now wants to modify the volume, or audio output level respectively, of the audio signal at the audio output 140, the volume regulator needs to be operated again. However, the volume regulator now follows a new volume operating curve. Thus, according to the invention, a new relationship between the middle position of the volume regulator and the amplification factor, or curve of the regulator, is defined and stored. Generally, the volume regulator is the regulator of the volume control and can be implemented as a mechanical regulator, a virtual regulator (e.g. on a display or touch screen) or any other regulator with a minimum position 132 and a maximum position 133. In the case of a virtual regulator, also the actuator is virtual.

Optionally, this procedure may be performed for various different audio sources 300 that may be connected to the audio input 110. Optionally, the audio amplifier unit may automatically recognize the audio source 300 connected to the audio input 110, store or retrieve the middle position of the volume regulator or the relationship between the middle position of the volume regulator and the factor or curve of the regulator respectively, and set the regulator correspondingly.

According to a further aspect of the present invention, different sound reproduction devices or output devices 200 may be connected to the audio output 140.

According to a further aspect of the present invention, the adjustment process may be performed not only for different audio input sources, but also for different audio output devices.

According to a further aspect of the invention, when an audio source 300 or an audio output device 200 is changed, then the audio amplifier unit may read the previously stored settings to adjust the volume regulator's operating curve, and drive the regulator to its respective position by using the actuator 135. E.g. if before the audio source 300 or the audio output device 200 being changed the amplifier was set to an above-average high volume, then this setting—considering the modified volume curve corresponding to the new audio source/output device—may be kept, and the volume regulator may be driven to its respective position by the actuator 135.

Thus, according to the invention, a separate relationship between the medium volume and the middle position of the volume control knob 130 may be stored, and may be retrieved and used if required, for different audio sources 300. The same applies for different output devices 200 that can be connected to the audio output 140.

Figure 2:
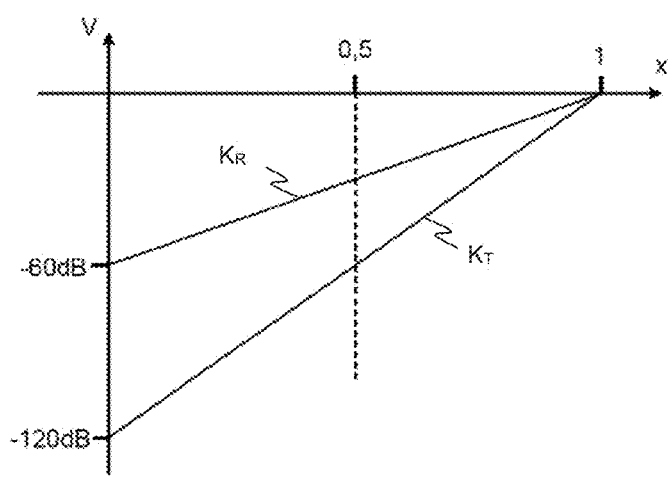
FIG. 2 shows two different logarithmic volume operating curves.

FIG. 2 shows two different logarithmic volume operating curves. Due to the scale, which is in Decibels and thus logarithmic, the curves appear straight. A first volume operating curve $K_T$ represents the complete range of possible volume settings. If this range is very large, a conventional volume regulator will react very sensitive to actuation. Even a small adjustment can have a large impact, which will be perceived as uncomfortable. Thus, for a small volume adjustment, the user would be forced to handle the volume regulator very carefully. A second volume operating curve $K_R$ has a lower slope, which makes its operation more comfortable, but it cannot cover the complete range of possible volume levels. According to the invention, an adapted operating curve is generated by operating the control member 150. The adapted operating curve has in its middle portion a slope according to the second volume operating curve $K_R$. In an embodiment, the adapted volume operating curve has in its outer portions slopes that allow coverage of the complete range of possible volume levels. Therefore, this adapted volume operating curve covers the same range of possible volume levels as the first volume operating curve $K_T$. In a different embodiment, the adapted volume operating curve has in its outer portions slopes that enable a coverage of a major portion of the range of possible volume levels, instead of the complete range. The position of the middle portion of the adapted volume operating curve depends on the volume that is set while operating the control member 150.

Figure 3:
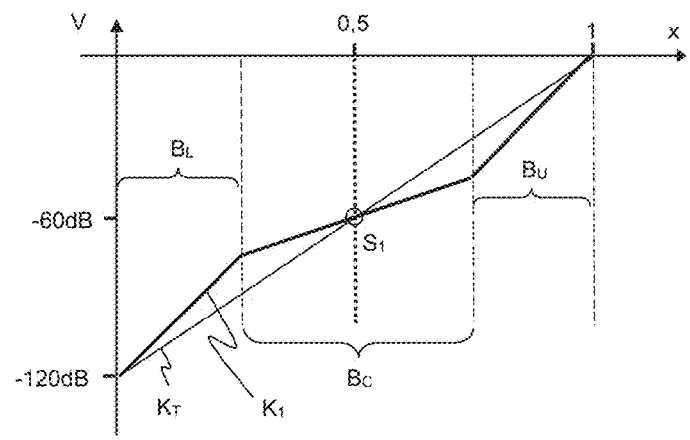
FIG. 3 shows a first individually adapted volume operating curve.

FIG. 3 shows a first individually adapted volume operating curve $K_1$. It consists of three sections or portions: a middle portion $B_C$ has a lower slope than the first volume operating curve $K_T$, e.g. corresponding to the second volume operating curve $K_R$ shown in FIG. 1. It may also be a different slope that is lower than the first volume operating curve $K_T$. The middle portion $B_C$ is positioned such that a desired volume, i.e. a particular point $S_1$ of the operating curve, corresponds to a middle position (x=0.5) of the regulator. When operating the regulator, it has a reduced sensitivity within the middle portion $B_C$, corresponding to the lower slope of the curve $K_1$ in this range. A lower portion $B_L$ of the operating curve $K_1$ connects the lower end of the middle portion $B_C$ with a minimum volume value, which in this example is at −120 dB. A higher portion $B_U$ of the operating curve $K_1$ connects the upper end of the middle portion $B_C$ with a maximum volume value, which in this example is at 0 dB (not attenuated). Therefore, due to the reduced sensitivity in the middle portion $B_C$, small to medium volume adjustments can easier be made, while still a very large (or in this example, the complete) range of volume control remains. In the example depicted in FIG. 3, both the lower portion $B_L$ as well as the higher portion $B_U$ of the operating curve $K_1$ have a higher slope than the middle portion $B_C$, and thus a higher sensitivity.

Figure 4:
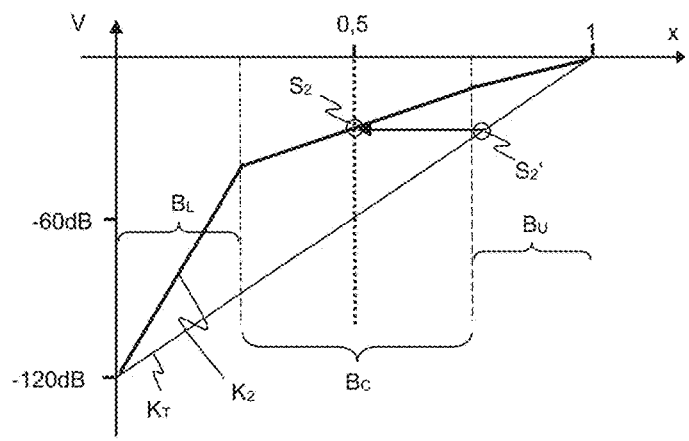
FIG. 4 shows a second individually adapted volume operating curve.

FIG. 4 shows a second individually adapted volume operating curve $K_2$, where the upper portion $B_U$ of the curve $K_2$ has a lower slope and thus a lower sensitivity than the middle portion $B_C$. In this case, the user has set a medium volume according to an operating point $S_2'$ on the first volume operating curve $K_T$. For this, the user has selected on any arbitrary volume operating curve that was previously set, a volume level corresponding to $S_2'$ and then re-adjusted the volume regulator, e.g. by using the control member 150,150'. This generates a new adapted volume operating curve $K_2$ that has the center $S_2$ of its middle portion $B_C$ shifted to a volume equal to that of $S_2'$. However, the slope and thus the sensitivity of the middle portion $B_C$ is not changed, and in this example is still that of the second volume operating curve $K_R$ in FIG. 1. Moreover, during the re-adjustment the volume regulator is moved to the middle position without changing the volume, as described above.

Figure 5:
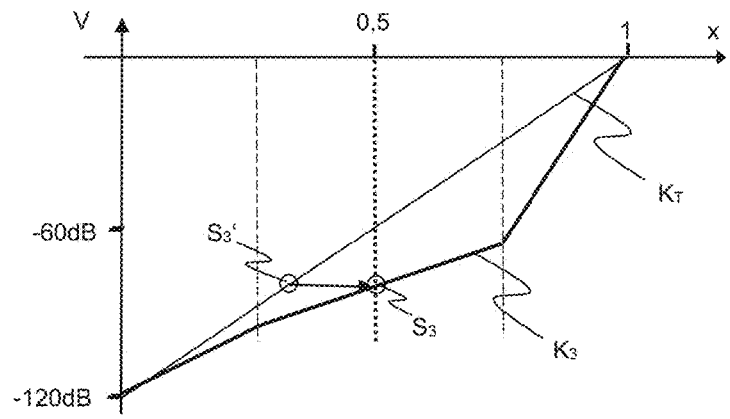
FIG. 5 shows a third individually adapted volume operating curve.

FIG. 5 shows a third individually adapted volume operating curve $K_3$. Here, the user has set a lower medium volume than in FIG. 2-4. The reason may be e.g. that a connected audio source provides a signal at a very high signal level. For this the user has selected, on any volume operating curve that was previously set, a volume level corresponding to $S_3'$ and then re-adjusted the volume regulator. As part of the re-adjustment, a new adapted volume operating curve $K_3$ is generated (e.g. calculated or retrieved from a storage) that has the center $S_3$ of its middle portion $B_C$ shifted to a volume equal to that of $S_3'$, and the volume regulator is moved to the middle position again.

Figure 6:
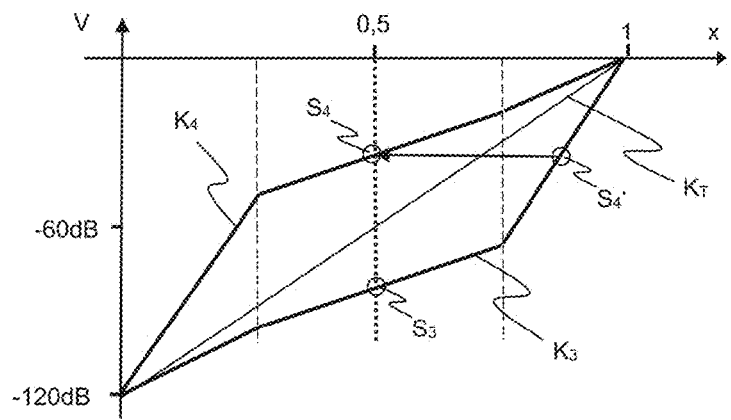
FIG. 6 shows a transition from a first to a second individually adapted volume operating curve.

FIG. 6 exemplarily shows a transition from a first individually adapted volume operating curve $K_3$ to a second individually adapted volume operating curve $K_4$. Based on the previously set individually adapted volume operating curve $K_3$, the user has selected a volume according to $S_4'$. For this, the volume regulator was rotated or shifted so far that the operating point $S_4'$ has left the middle portion $B_C$ of the operating curve and is located in the upper portion $B_U$, where the slope of the first individually adapted volume operating curve $K_3$ is higher. After the re-adjustment, e.g. using the control member 150,150', the second operating curve $K_4$ is generated, whose middle portion $B_C$ is centered at the selected volume $S_4$. The volume regulator now follows the second individually adapted volume operating curve $K_4$.

Figure 7:
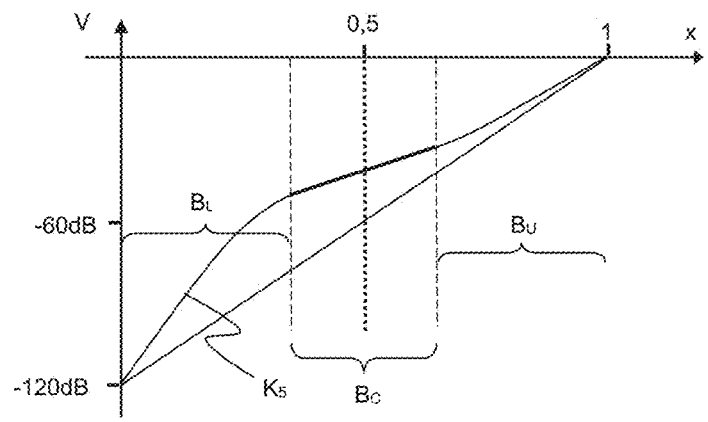
FIG. 7 shows an individually adapted volume operating curve with smoothed transitions between portions.

The transitions between the different portions need not necessarily be abrupt, as above. FIG. 7 shows an individually adapted volume operating curve with smoothed transitions between the different portions. Also, the various portions $B_C$, $B_L$, $B_U$ of the adapted operating curve need not necessarily be exactly logarithmic (or depicted as a straight line in a diagram with logarithmic scale), but may deviate slightly. However, the slope of the middle portion is always lower than that of the first volume operating curve $K_T$ that connects the values for minimum and maximum volume directly.

Figure 8:
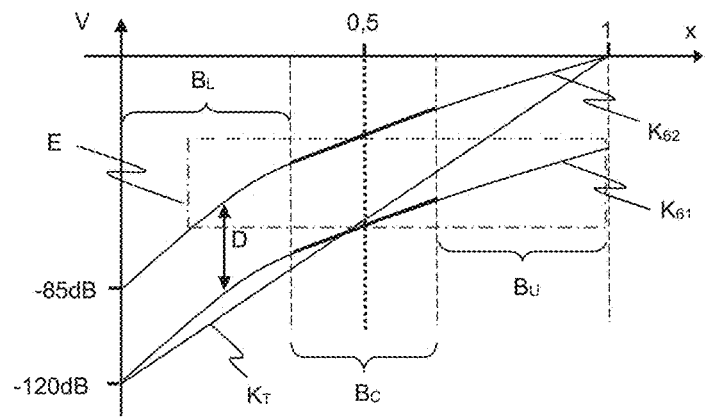
FIG. 8 shows individually adapted volume operating curves according to another embodiment of the invention.

In an embodiment, not the complete volume range is covered by the currently set volume operating curve, but it is possible to switch between different volume operating curves that all together cover the complete volume range. FIG. 8 shows an example where a first minimum volume operating curve $K_{61}$ exemplarily covers a volume range from −120 dB to −15 dB. A second maximum volume operating curve $K_{62}$ covers a volume range from −105 dB to 0 dB. The two curves run parallel, i.e. the distance D between the curves is constant. Other possible operating curves are between them and also run parallel to them. The middle portion $B_C$ of each curve has a lower slope than the first volume operating curve $K_T$. Selecting a desired volume level based on a current volume operating curve and re-adjusting the volume regulator switches to a new volume operating curve, which has a center value corresponding to the current volume level if it is within an adjustment window E. Otherwise it may be switched to an adjacent volume operating curve, i.e. to $K_{61}$ or $K_{62}$. E.g. in the depicted example, with a currently valid volume operating curve $K_{61}$ and a desired volume level at the right-hand edge of the curve (maximum volume level selectable with $K_{61}$), it is possible by re-adjustment to switch to the maximum volume operating curve $K_{62}$ that has a center value (x=0.5) exactly at this volume level. With a currently valid volume operating curve $K_{62}$ and a desired volume level at the left-hand edge of the curve (minimum volume level selectable with $K_{62}$), it is possible to switch to the minimum volume operating curve $K_{61}$ by re-adjustment.

Figure 9:
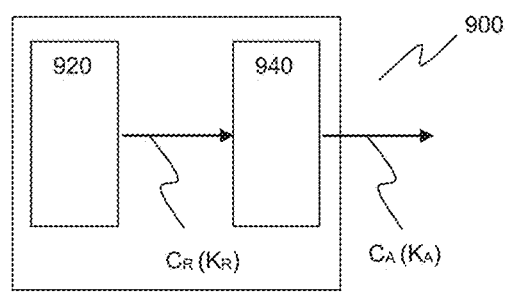
FIG. 9 shows a block diagram of a volume regulator.

FIG. 9 shows a block diagram of a volume regulator 900. It comprises a volume operating member 920 that may be operated by a user and that has a particular, fixed raw operating curve $K_R$. It outputs a control value $C_R$ according to the user-defined setting and according to the raw operating curve $K_R$. An operating curve adaptation unit 940 converts the control value $C_R$ according to the raw operating curve $K_R$ into a control value $C_A$ according to an adapted operating curve $K_A$. The operating curve adaptation unit 940 may receive the adapted operating curve $K_A$, or an adaptation rule respectively, from outside, or create and store it on its own. For example, the volume operating member 920 may be an analog potentiometer with a logarithmic operating curve. Then, the raw operating curve $K_R$ corresponds to the first operating curve $K_T$, for example. In another example, the volume operating member 920 is a digital rotary pulse encoder that provides only "up" or "down" pulses, so that the raw operating curve $K_R$ comprises only the discrete values "up", "inactive" and "down". The control value $C_A$ converted according to the adapted operating curve $K_A$ by the operating curve adaptation unit 940 may be used e.g. for controlling the amplification of an amplifier circuit. The operating curve adaptation unit 940 may be implemented as a computing unit, a control unit or a processor, and may be configured by a software program.

The invention may be used in particular for regulators that cover a very large control range while still allowing an improved fine adjustment around a currently selected value. This is particularly advantageous for volume control.

While this invention has been described in conjunction with the specific embodiments outlined above, it is evident that many alternatives, modifications, and variations will be apparent to those skilled in the art. Accordingly, the pre-

What is claimed is:

1. A method for controlling an audio amplifier unit, wherein the audio amplifier unit comprises an audio input, an amplifier, a volume regulation unit, and an audio output, the method comprising:
   amplifying an audio signal received via the audio input, wherein a first amplification of the amplifier is selected according to a first volume operating curve, which is a currently valid operating curve, by utilizing the volume regulation unit, wherein, according to the first volume operating curve, a first sensitivity of the volume regulation unit corresponds to the first amplification;
   detecting a modified setting of the volume regulation unit made by a user;
   calculating a modified amplification value from the modified setting of the volume regulation unit according to the first volume operating curve, wherein the modified amplification value corresponds to a modified volume, and wherein, according to the first volume operating curve, a second sensitivity of the volume regulation unit corresponds to the modified amplification, the second sensitivity being higher than the first sensitivity;
   modifying the amplification of the amplifier to be the modified amplification value;
   after the amplification of the amplifier is modified and upon a trigger signal, automatically performing an adjustment procedure, wherein a second volume operating curve is determined, wherein the second volume operating curve becomes the currently valid operating curve, and wherein said modified amplification value is substantially in the center of the second volume operating curve, wherein, according to the second volume operating curve, a third sensitivity of the volume regulation unit corresponds to the modified amplification, the third sensitivity being substantially equal to the first sensitivity; and
   mechanically and/or electrically adjusting the volume regulation unit to be in a predefined position.

2. The method according to claim 1;
   wherein the volume regulation unit comprises:
   a rotary knob with a first position, a second position, and a third position; and
   an actuator configured to mechanically, electrically, or mechanically and electrically adjust the rotary knob so that the first position is in a middle position.

3. The method according to claim 1;
   wherein the adjustment procedure is performed for a plurality of different audio sources connected to the audio input or for a plurality of different output devices connected to the audio output; and
   wherein determined settings are stored.

4. The method according to claim 1;
   wherein a sensitivity of the volume regulation unit in a middle portion of the currently valid operating curve is lower than on average over the complete currently valid operating curve.

5. The method according to claim 1;
   wherein the trigger signal for the adjustment procedure is launched by a user operating a control member.

6. The method according to claim 1;
   wherein an amplification value of the first amplification is substantially in the middle of the first volume operating curve; and
   wherein the modified amplification value is not substantially in the middle of the first volume operating curve.

7. The method according to claim 1;
   wherein the first operating curve and the second operating curve are frequency-independent.

8. The method according to claim 1, further comprising:
   detecting whether the volume regulation unit has remained for a predefined time at said modified setting,
   wherein the trigger signal is launched automatically after the volume regulation unit is detected to have remained at said modified setting for the predefined time.

9. A method for controlling an audio amplifier unit, wherein the audio amplifier unit comprises an audio input, an amplifier, a volume regulation unit, and an audio output, the method comprising:
   amplifying an audio signal received via the audio input by a first amplification value, the first amplification value corresponding to a first operating point on a first volume operating curve associated with the volume regulation unit, the first operating curve having a first slope at the first operating point;
   detecting a modified setting of the volume regulation unit made by a user, wherein the modified setting results in a second amplification value corresponding to a second operating point on the first volume operating curve, the first operating curve having a second slope at the second operating point that is different from the first slope;
   controlling the amplifier to amplify the audio signal by the second amplification value;
   after detecting the modified setting of the volume regulation unit and controlling the amplifier by the second amplification value, automatically performing an adjustment procedure, wherein a second volume operating curve is determined and assigned to the volume regulation unit, and wherein said second amplification value corresponds to a third operating point on the second volume operating curve, the third operating point having a third slope lower than the second slope.

10. The method according to claim 9, further comprising:
    after controlling the amplifier to amplify the audio signal by the second amplification value and before performing the adjustment procedure, detecting whether the user operates a control member; and
    performing the adjustment procedure in response to the control member being operated.

11. The method according to claim 9;
    wherein the third operating point is substantially in the center of the second volume operating curve.

12. The method according to claim 11;
    wherein said adjustment procedure further comprises mechanically and/or electrically adjusting the volume regulation unit to be in a substantially centered position.

13. The method according to claim 9;
    wherein the first operating curve and the second operating curve are frequency-independent.

14. The method according to claim 9;
    wherein the second slope is higher than the first slope and the third slope is substantially equal to the first slope, and
    wherein a higher slope of a volume operating curve corresponds to a higher sensitivity of the volume regulation unit.

15. The method according to claim 9, further comprising:
    detecting whether the volume regulation unit has remained for a predefined time at said modified setting, wherein the adjustment procedure is automatically performed after said predefined time.

16. An audio amplifier unit comprising:

an audio input;

a volume regulation unit with a setting that is configured to be modified by a user;

an amplifier configured to amplify an audio signal received via the audio input, wherein a first amplification of the amplifier is set according to a first operating point on a first volume operating curve, the first volume operating curve defining a first relationship between a setting of the volume regulation unit and an amplification of the amplifier, and the first volume operating curve having a first slope at the first operating point;

an audio output to which a sound reproduction device may be connected; and a control unit configured to perform an adjustment, upon a trigger signal and after the volume regulation unit was modified by the user to operate at a second operating point on the first volume operating curve, the second operating point corresponding to a second amplification and having a second slope on the first volume operating curve, wherein the adjustment performed by the control unit comprises determining and storing a second volume operating curve and assigning the second volume operating curve to the volume regulation unit, wherein the second amplification corresponds to a third operating point on the second volume operating curve and wherein the second volume operating curve at the third operating point has a third slope that is lower than the second slope on the first operating curve.

17. The audio amplifier according to claim 16;

wherein the adjustment does not modify the amplification of the amplifier.

18. The audio amplifier according to claim 16;

wherein the volume regulation unit comprises a volume operating member, the audio amplifier further comprising an actuator for adjusting the volume operating member, and wherein the adjustment further comprises adjusting the volume operating member of the volume regulation unit mechanically or electrically such that it is in a substantially central position.

19. The audio amplifier according to claim 16;

wherein the third operating point is substantially in the center of the second volume operating curve.

20. The audio amplifier according to claim 16;

wherein the first operating curve and the second operating curve are frequency-independent.

21. The audio amplifier according to claim 16;

wherein the control unit is further configured to:

detect whether the volume regulation unit operated at the second operating point for a predefined time, and upon a detection that the volume regulation unit has operated at the second operating point after said predefined time, launch the trigger signal automatically.

22. An audio amplifier unit comprising:

a volume regulator with a setting that is configured to be modified by a user, the volume regulator comprising a volume operating member and a control unit; and an amplifier configured to amplify an audio signal by a variable amplification controlled by the volume regulator, wherein the amplification of the amplifier is defined according to a first volume operating curve defining a first relationship between a setting of the volume regulator and an amplification of the amplifier, and a first amplification is set according to a first operating point on a first volume operating curve, and wherein the first volume operating curve has a first slope at the first operating point;

wherein the control unit is configured to:

assign a second amplification to the amplifier upon the volume operating member being modified by the user, the second amplification corresponding to a second operating point on the first volume operating curve, wherein the first volume operating curve at the second operating point has a second slope that is higher than the first slope;

perform an adjustment, after assigning the second amplification value to the amplifier, wherein the adjustment performed by the control unit comprises:

determining and storing a second volume operating curve; and assigning the second volume operating curve to the volume regulator, wherein on the second volume operating curve the second amplification corresponds to a third operating point, the third operating point having a third slope that is substantially equal to the first slope on the first operating curve.

* * * * *